United States Patent
Abel et al.

(10) Patent No.: US 7,330,060 B2
(45) Date of Patent: Feb. 12, 2008

(54) METHOD AND APPARATUS FOR SIGMA-DELTA DELAY CONTROL IN A DELAY-LOCKED-LOOP

(75) Inventors: Christopher J. Abel, Coplay, PA (US); Abhishek Duggal, Allentown, PA (US); Peter C. Metz, Macungie, PA (US); Vladimir Sindalovsky, Perkasie, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 11/221,387

(22) Filed: Sep. 7, 2005

(65) Prior Publication Data

US 2007/0052463 A1    Mar. 8, 2007

(51) Int. Cl.
  *H03L 7/06* (2006.01)
(52) U.S. Cl. .................. 327/158; 327/161; 327/163
(58) Field of Classification Search ................ 327/141, 327/147, 149, 153, 156, 158, 161–163
  See application file for complete search history.

(56) References Cited

U.S. PATENT DOCUMENTS 6,327,318 B1 * 12/2001 Bhullar et al. .............. 375/374
6,765,445 B2 *  7/2004 Perrott et al. ................. 331/17
6,803,827 B1 * 10/2004 Kenney et al. ............... 331/16
6,828,866 B2 * 12/2004 Liu ............................. 331/57
6,876,710 B1 *  4/2005 Pitzer et al. ................ 375/371
7,068,113 B2 *  6/2006 Jasa et al. .................... 331/44
7,145,975 B2 * 12/2006 Yen et al. .................... 375/376

OTHER PUBLICATIONS

Alexander, J.D.H, "Clock Recovery from Random Binary Signals," Electronics Letters, vol. 11, pp. 541-542 (Oct. 1975).

* cited by examiner

*Primary Examiner*—N. Drew Richards
*Assistant Examiner*—Hai L. Nguyen

(57) ABSTRACT

Methods and apparatus are provided for sigma-delta delay control in a Delay-Locked-Loop that employs a delay line to generate a clock signal based on a reference signal. A first value is generated if a clock signal has a time lead relative to a reference signal; and a second value is generated if a clock signal has a time lag relative to a reference signal. The first and second values are accumulated to generate an N bit digital word; and the N bit digital word is reduced to an M bit digital word, where M is less than N. Thereafter, the M bit digital word can be converted to an analog bias signal. The reducing step can be performed, for example, by a sigma-delta modulator. The high frequency quantization noise generated by the sigma-delta modulator can be filtered using a low pass filter. The converting step can be performed by a digital-to-analog converter, such as a master/slave digital-to-analog converter.

24 Claims, 5 Drawing Sheets

US 7,330,060 B2

METHOD AND APPARATUS FOR SIGMA-DELTA DELAY CONTROL IN A DELAY-LOCKED-LOOP

CROSS-REFERENCE TO RELATED APPLICATIONS

The present application is related to U.S. patent application Ser. No. 11/141,498, entitled "Method and Apparatus for Master/Slave Digital-To-Analog Conversion," filed May 31, 2005 and incorporated by reference herein.

FIELD OF THE INVENTION

The present invention is related to delay-locked loops and, more particularly, to the use of delay-locked loops for controlling the time delay of series-connected delay elements in a voltage-controlled delay line.

BACKGROUND OF THE INVENTION

A wide variety of applications, including certain clock and data recovery (CDR) architectures, require a set of evenly spaced clock waveforms to sample a received data waveform. In these applications, this set of clock waveforms is typically generated by using a voltage-controlled delay line (VCDL). A voltage-controlled delay line 110, as shown in FIG. 1, is an electrical circuit that is comprised of a plurality of sequentially arranged time delay elements, which is often known as a delay chain, driven by a reference clock signal. Thus, an N-cell VCDL generates N output clocks, where each successive output clock is delayed from the input clock by an additional unit delay. The time delays of each of the individual elements that comprise the chain are substantially equal, and are controlled by an analog voltage, $V_{CTRL}$.

It is typically desired that the total delay through the chain of N delay cells be equal to the period, T, of the input reference clock signal, CLKIN. As shown in FIG. 2, this implies that the time delay between the rising edges (and the delay between the falling edges) of adjacent output clocks is equal to T/N, and also that the rising (and falling) edges of the output of the Nth delay cell, $OUT_N$, are aligned to the rising (and falling) edges of CLKIN. In addition, if the duty cycle of CLKIN is exactly 50%, it can be seen that for any two output clocks that are separated by exactly N/2 cells in the chain, the rising (falling) edge of the earlier clock is aligned to the falling (rising) edge of the later clock.

The time delay through an electrical delay cell varies significantly due to variations in the manufacturing process and in operating temperature and power supply voltage. Thus, most applications of VCDLs require a continuous feedback loop, known as a delay-locked loop (DLL), which senses the alignment between the edges of relevant clocks and varies $V_{CTRL}$ to increase or decrease the delay of each stage in the chain, as appropriate, to hold the total VCDL delay equal to T.

Typically, a phase detector in the DLL senses the alignment of one edge of an "early" clock to a corresponding edge of a "late" clock. For example, the phase detector may sense the alignment between the rising edge of the input clock and the rising edge of the output of the final delay cell in the chain. Alternatively, if the duty cycle of the input clock is substantially equal to 50%, then the phase detector may sense the alignment between the rising edge of one clock in the chain and the falling edge of the clock that is generated N/2 stages later in the chain. If the rising edges of the late clock lag those of the early clock, then the total time delay through the delay chain is too high, and the phase detector generates an upward control signal having a pulse width that is equal to the time lag (assuming an implementation where raising the control voltage decreases the delay per stage). Likewise, if the rising edges of the late clock lead those of the early clock, then the total time delay through the delay chain is too low, and the phase detector generates a downward control signal having a pulse width that is equal to the time lead. The upward and downward control signals are typically applied to a charge pump that generates a positive or negative current pulse having a pulse width that is proportional to the misalignment between the early and late clock edges. Thereafter, the current pulse generated by the charge pump is typically integrated by a loop filter capacitor; and the voltage across this capacitor, $V_{CTRL}$, controls the delay of the VCDL delay elements.

The charge pump and integration capacitor in a traditional DLL typically require large area, contributing to the size of an integrated circuit incorporating such a DLL. In addition, since the pulse width of the current generated by the charge pump is proportional to the time difference between the edges of the early and late clocks, the pulse width must get progressively smaller as this time difference is reduced. In practice, however, the generation of such small current pulses is difficult and often will result in imperfect linearity as the phase difference approaches zero (0).

A number of techniques have been proposed or suggested to circumvent these problems. For example, one proposed technique avoids narrow current pulses by employing a bang-bang phase detector, such as those described in J. D. H. Alexander, "Clock Recovery from Random Binary Signals," Electronics Letters, Vol. 11, 541-42 (October, 1975). Generally, a bang-bang phase detector determines whether the late clock leads or lags the early clock, and generates an upward or downward control signal of fixed pulse width, U/D, indicating whether there is a time lag or lead, respectively. Since the pulse width of the phase detector output is constant, a DLL that uses a bang-bang phase detector will not suffer from the problems posed by charge pump linearity. In order to limit the cycle by cycle variation in control voltage, $V_{CTRL}$, that results from the individual current pulses generated by the charge pump, the integration capacitor must be especially large.

In an alternate approach, a digital accumulator is employed to process the output of the bang-bang phase detector, and a digital-to-analog converter (DAC) transforms the digital output of the accumulator into the analog control voltage, $V_{CTRL}$. The digital accumulator acts as an integrator, replacing the charge-pump and integration capacitor. However, in order to minimize the $V_{CTRL}$ variation due to an individual pulse output by the phase detector, without limiting the DAC output voltage range, the number of bits, N, processed by the digital accumulator and DAC must be large. The cost of a DAC increases with the number of bits, N, and quickly becomes prohibitively expensive.

A need therefore exists for improved techniques for controlling the phase or delay in an analog delay line. A further need exists for an improved delay control circuit for a DLL that exhibits reduced area requirements.

SUMMARY OF THE INVENTION

Generally, methods and apparatus are provided for sigma-delta delay control in a Delay-Locked-Loop that employs a delay line to generate a clock signal based on a reference signal. According to one aspect of the invention, a delay control method is provided for a Delay-Locked-Loop circuit. A first value is generated if a clock signal has a time lead relative to a reference signal; and a second value is generated if a clock signal has a time lag relative to a reference signal. The first and second values are accumulated to generate an N bit digital word; and the N bit digital word is reduced to an M bit digital word, where M is less than N. Thereafter, the M bit digital word can be converted to an analog bias signal.

In the exemplary embodiment, the reducing step is performed by a sigma-delta modulator, but other variations are possible, as would be apparent to a person of ordinary skill in the art. For example, any randomizer circuit that generates a sequence of M-bit output words whose time average converges to its N-bit input could be used to perform the reducing step. According to another aspect of the invention, the high frequency quantization noise generated by the sigma-delta modulator can be filtered using a low pass filter.

According to yet another aspect of the invention, the converting step can be performed by a digital-to-analog converter. In one implementation, the digital-to-analog converter is a master/slave digital-to-analog converter. The master/slave digital-to-analog converter may be comprised, for example, of a master digital-to-analog converter and a slave digital-to-analog converter and wherein each step of the slave digital-to-analog converter is proportional to the output of the master digital-to-analog converter.

A more complete understanding of the present invention, as well as further features and advantages of the present invention, will be obtained by reference to the following detailed description and drawings.

DETAILED DESCRIPTION

Figure 1:
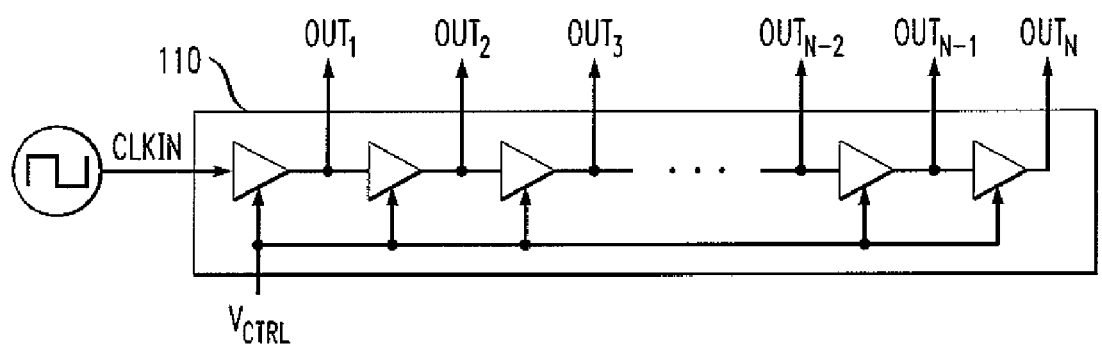
FIG. 1 illustrates a conventional VCDL circuit.
Figure 2:
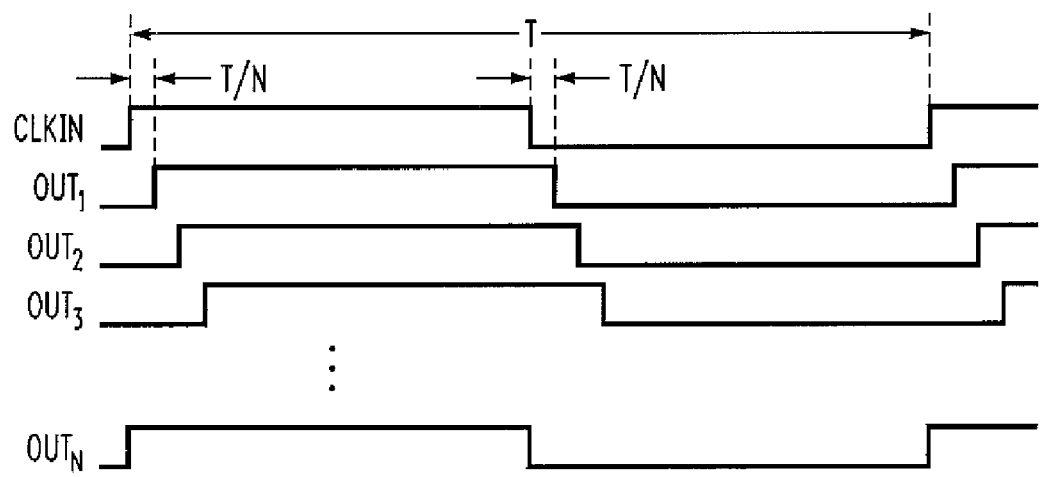
FIG. 2 illustrates a reference clock and output clocks for the VCDL of FIG. 1.
Figure 3:
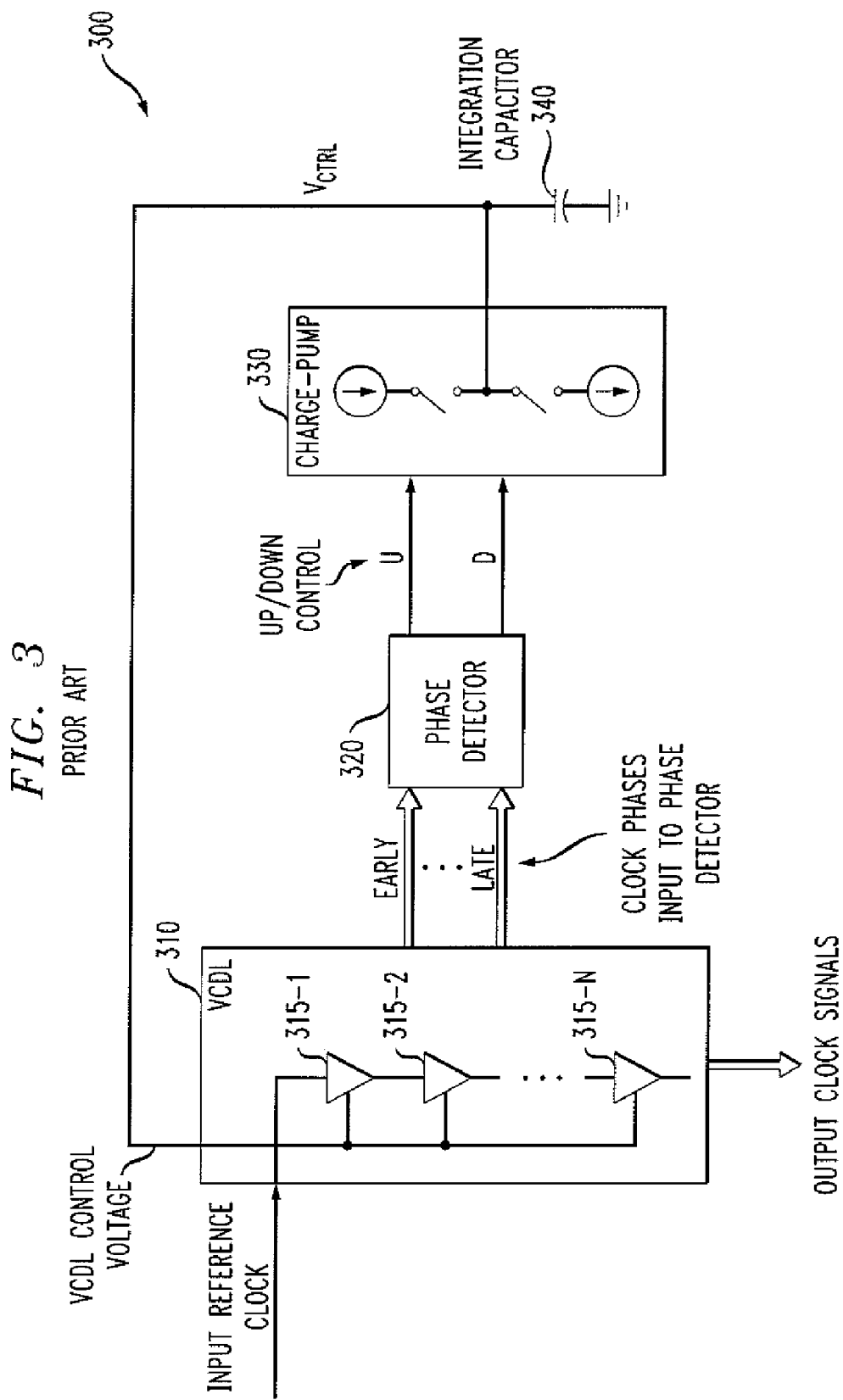
FIG. 3 illustrates a conventional DLL circuit.

FIG. 3 illustrates a conventional DLL circuit 300. As shown in FIG. 3, the DLL circuit 300 comprises a voltage controlled delay line (VCDL) 310, a phase detector 320, a charge pump 330, and an integration capacitor 340. The voltage controlled delay line 310 can be embodied, for example, using the VCDL circuits described in U.S. patent application Ser. No. 10/999,900, filed Nov. 30, 2004, entitled, "Voltage Controlled Delay Loop and Method with Injection Point Control," incorporated by reference herein.

As shown in the exemplary embodiment of FIG. 3, a voltage controlled delay line 310 is typically comprised of a cascaded chain of delay elements 315-1 through 315-N, hereinafter, collectively referred to as delay elements 315, each having a nominal delay value that is controlled by the integration capacitor voltage, $V_{CTRL}$, to produce a plurality of phase shifted clock signals, such as the "early" and "late" clock signals shown in FIG. 3, as well as a plurality of additional output clock signals.

Generally, a linear phase detector 320 determines the time difference between rising edges of the early and late clock signals generated by the voltage controlled delay line 310. If the phase detector 320 detects that the late clock lags the early clock, the phase detector 320 generates an upward control signal, U, the pulse width of which is proportional to the time lag. Likewise, if the phase detector 320 detects that the late clock leads the early clock, the phase detector 320 generates a downward control signal, D, the pulse width of which is proportional to the time lead. Alternatively, if phase detector 320 is implemented as a bang-bang phase detector, then the pulse width of the U and D signals is constant.

The charge pump 330 generates a positive or negative current pulse having a pulse width that is equal to the pulse width of the corresponding U or D signal. As shown in FIG. 3, the current pulse generated by the charge pump 330 is integrated by a loop filter, such as a capacitor 340, in a known manner.

Figure 4:
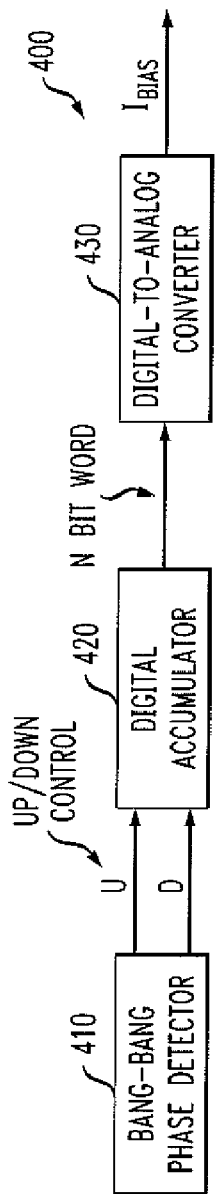
FIG. 4 illustrates an alternate implementation of the DLL circuit of FIG. 3, in which the analog integrator is replaced by a digital integrator and a digital-to-analog converter.

FIG. 4 illustrates an alternate implementation of phase detection and digital-to-analog conversion techniques for the DLL circuit of FIG. 3. The implementation shown in FIG. 4 recognizes that the bang-bang phase detector will always toggle and generate an upward or downward control signal, U/D, and never reach the desired phase difference value of 0. As shown in FIG. 4, a digital accumulator 420 is employed to process the output of a bang-bang phase detector 410. The digital accumulator 420 acts as an integrator, replacing the charge-pump 330 and integration capacitor 340. The loop bandwidth of the DLL of FIG. 3 is reduced by increasing the size of the integration capacitor 340; a similar effect is achieved in FIG. 4 by increasing the width of the digital word in digital accumulator 420.

Assuming the bang-bang phase detector 410 generates a value of +1 (i.e., upward control signal U is asserted) to indicate that the late clock lags the early clock, and a value of −1 (i.e., downward control signal D is asserted) to indicate that the late clock leads the early clock, the digital accumulator 420 will add the generated values of +1 and −1 and produce an N bit digital word that is applied to a digital-to-analog converter 430. For example, in an 8 bit implementation, the output of the digital accumulator 420 will vary between 0 and 255. The digital-to-analog converter 430 generates a control voltage, $V_{CTRL}$, based on the digital word.

In a DLL application of the circuit of FIG. 4, the delay of each delay cell in the VCDL can only take on a finite number of values, due to the finite number of quantization levels in DAC 430. If the desired delay value is not precisely equal to one of these levels, the DLL loop will cause the delay to oscillate back and forth between two levels which most closely bracket the desired delay, causing significant jitter in the VCDL output clocks. In order to minimize this jitter, the number of bits, N, processed by the digital accumulator 420 and digital-to-analog converter 430 must be large. The cost of a digital-to-analog converter 430 increases with the number of bits, N, and quickly becomes prohibitively expensive.

Sigma-Delta Delay Control

Figure 5:
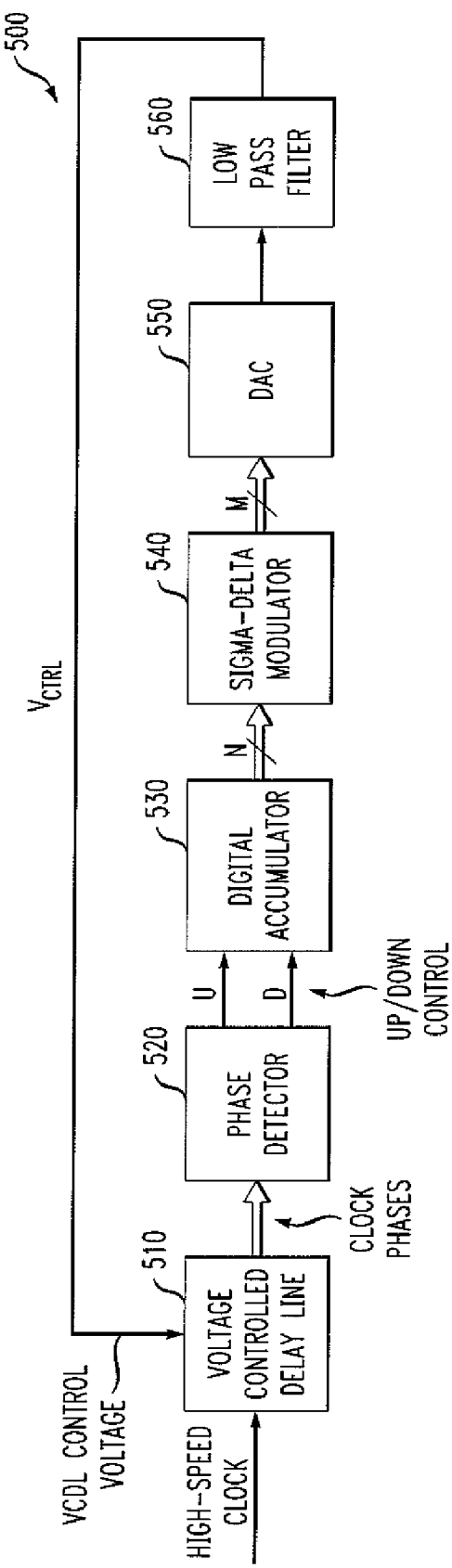
FIG. 5 is a block diagram of a DLL circuit incorporating features of the present invention.

FIG. 5 is a schematic block diagram of a DLL circuit 500 incorporating features of the present invention. Generally, the DLL circuit 500 employs a sigma-delta modulator 540 to convert the high resolution quantized data of the digital accumulator 530 into lower resolution quantized data that can be converted to an analog signal by a digital-to-analog converter 540. The Voltage Controlled Delay Line 510 operates in the same manner as described above in conjunction with FIG. 3 to produce a plurality of phase shifted clock signals. The Voltage Controlled Delay Line 510 can be embodied, for example, using the VCDL circuits described in U.S. patent application Ser. No. 10/999,900, filed Nov. 30, 2004, entitled, "Voltage Controlled Delay Loop and Method with Injection Point Control," incorporated by reference herein. The sigma-delta modulator 540 may be embodied, for example, using any of the techniques that are widely described in the literature, for example, J. Candy and G. Temes, "Oversampling Methods for A/D and D/A Conversion," in Oversampling Delta-Sigma Converters, 1-25 (1992, IEEE Press).

The phase detector 520 operates in the same manner as described above in conjunction with FIG. 4 to determine the phase difference between adjacent rising edges of the clock signal generated by the voltage controlled delay line 510 and generate an upward or downward control signal, U/D, indicating whether there is a time lag or lead, respectively. The phase detector 520 may be implemented, for example, as a bang-bang phase detector 320, such as those described in J. D. H. Alexander, "Clock Recovery from Random Binary Signals," Electronics Letters, Vol. 11, 541-42 (October, 1975).

As previously indicated, the digital accumulator 530 (with a large number of bits, N) acts as an integrator, replacing the charge-pump 330 and integration capacitor 340 of FIG. 3. According to one aspect of the present invention, the sigma-delta modulator 540 converts the high resolution quantized data, generated by the digital accumulator 530, into lower resolution quantized data for the DAC 540. As shown in FIG. 5, the N bit output of the digital accumulator 530 is reduced to an M bit output by the sigma-delta modulator 540, where M is less than N. For example, if the digital accumulator 530 employs N=10 bits, and the sigma-delta modulator 540 provides an M=8 bit output, the sigma-delta modulator 540 must translate the 1024 levels provided by the digital accumulator 530 to one of 256 levels (8 bits). In other words, each step of the sigma-delta modulator 540 covers 4 steps of the digital accumulator 530. Thus, if the digital accumulator 530 generates a decimal value of 126 (126/1024), which is midway between levels 31 and 32 of the sigma-delta modulator 540, the sigma-delta modulator 540 will alternately generate values of 31 and 32, such that the time average is 31.5.

According to another aspect of the invention, the sigma-delta modulator 540 also performs "noise-shaping" of the quantization noise of DAC 550. Generally, the sigma-delta modulator 540 shifts the quantization noise of the M-bit DAC, which for a random input is typically white, to a high frequency range where a low-pass-filter (LPF) 560 is optionally employed to attenuate this noise component.

In this manner, the phase control techniques in the DLL of the present invention eliminate the area required by the large integration capacitor in the DLL of FIG. 3, while also significantly reducing the cost of the DAC in the DLL of FIG. 4.

Figure 6:
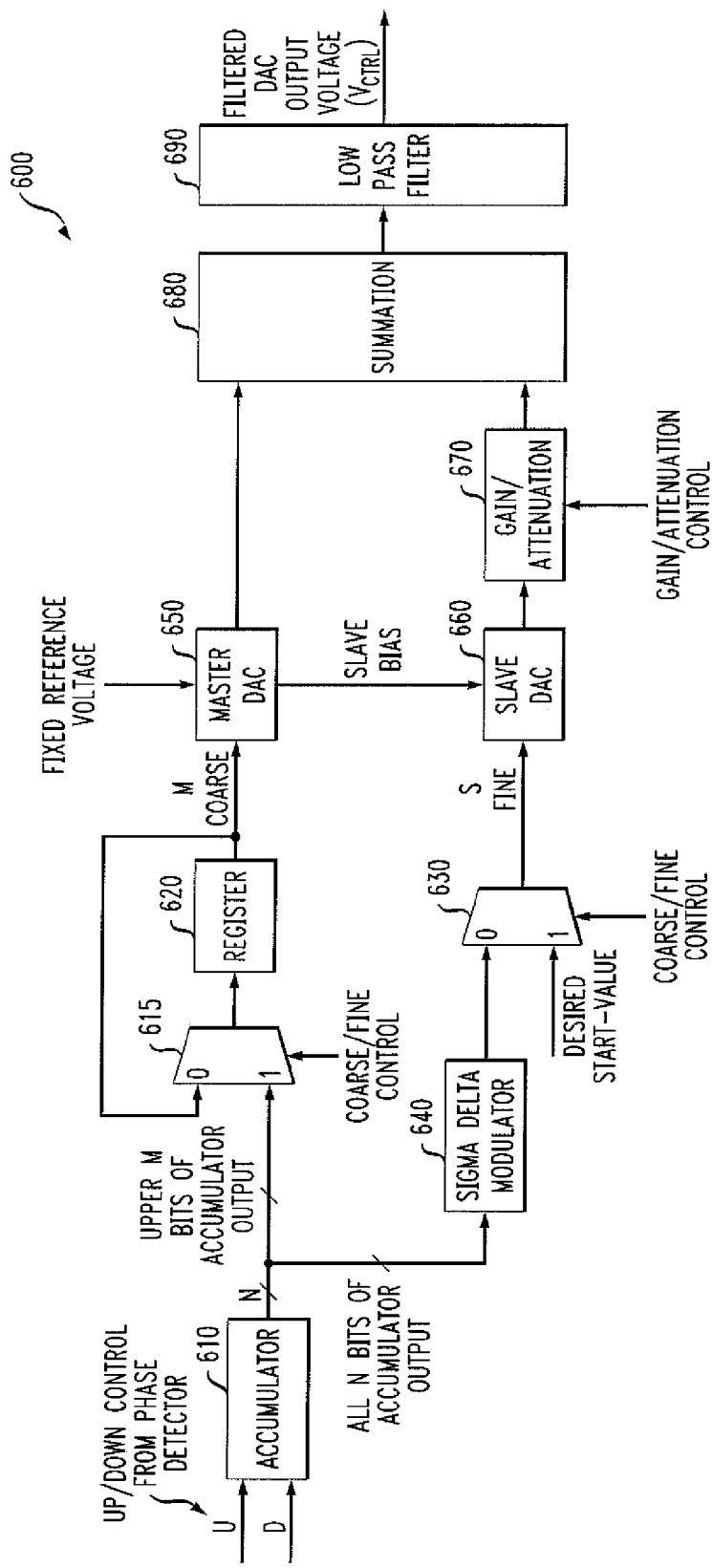
FIG. 6 is a block diagram of an alternate digital-to-analog conversion technique for a DLL circuit incorporating features of the present invention.

FIG. 6 is a schematic block diagram of an alternate digital-to-analog conversion technique for a DLL circuit 600 incorporating features of the present invention. Only the relevant portions of the DLL circuit 600 are shown in FIG. 6 to simplify the discussion. The present invention recognizes that a "coarse" locking mode does not require the same DAC resolution as a "fine" locking mode. Thus, according to another aspect of the invention, the DLL circuit 600 employs a master DAC 650 that is used during DLL "coarse" locking, and a slave DAC 660 that is used during DLL "fine" locking. As shown in FIG. 6, the coarse and fine locking modes are controlled by a coarse/fine control signal that is applied to multiplexers 615 and 630 in the exemplary embodiment. Based on the applied value of the coarse/fine control signal, the multiplexers 615 and 630 select a corresponding input.

The up/down control signal from the phase detector (not shown in FIG. 6) is applied to the digital accumulator 610 that generates a corresponding N bit value, in the manner described above. The upper M bits (between N−1:N−M) are applied to the multiplexer 615. In a coarse mode, these M bits are passed through a register 620 and applied to a master DAC 650, that is biased by a fixed reference voltage. The master DAC 650 generates a voltage signal that is applied to a summation stage 680.

In addition, as shown in FIG. 6, the master DAC 650 generates a slave bias signal that biases the slave DAC 660 and is proportional to the master DAC output current. Generally, each quantization level (i.e., step) of the slave DAC 660 generates an analog value (e.g., an output voltage) that is substantially proportional to the output of the master DAC 650. In one implementation, each step of the slave DAC 660 generates an output voltage that is a fixed percentage of the voltage value generated by the master DAC 650.

In the coarse mode, the slave DAC 660 is started with a desired start value, such as a mid-range value, that is selected by the multiplexer 630, and applied to the slave DAC 660. The slave DAC 660 generates a voltage based on the desired start value and the slave bias signal. The output of the slave DAC 660 is then processed by a gain/attenuation stage 670 and added to the output of the master DAC 650 by the summation stage 680.

In one exemplary implementation discussed herein, following a reset, the DLL circuit 600 enters a coarse mode and generates a maximum value for the master DAC 650 (which in turn minimizes the delays in the VCDL 510) and generates a mid-range value for the slave DAC 660. Assuming that the minimum total delay value in VCDL 510 is less than the period of the input reference clock, then the late clock will lead the early clock, as seen by the phase detector, and thus the phase detector asserts the down control signal (D). As a result, the digital word that drives the master DAC 650 decreases (causing delays in the VCDL 510 to increase, and the accumulator 610 counts down) and the digital word that drives the slave DAC 660 maintains its mid-range value.

Once the delays in the VCDL 510 are close to the appropriate value, the phase detector 520 will generate consecutive up-down control signals (U/D). This event, which marks the end of the coarse locking phase, can be sensed, for example, by a finite state machine (not shown) causing the coarse/fine control signal to be set to a logic value of 0. When the coarse/fine control signal has a logic value of 0, the last digital word that controls the master DAC 650 is maintained, and the digital word that drives the slave DAC 660 is allowed to vary from its mid-range value. Thereafter, the slave DAC 660 changes states as the DLL circuit acquires a locked condition. In this manner, the finite state machine detects when the DLL circuit 600 is approaching a phase locked condition, freezes the coarse value of the master DAC 650 and allows the slave DAC 660 to take over in a "fine" locking mode to make subtle adjustments to the phase.

In a fine mode, the sigma-delta modulator 640 processes the N bit digital word generated by the accumulator 610 and generates an S bit word that is selected by the multiplexer 630 to control the slave DAC 660. The output of the slave DAC 660 can be increased or decreased by the gain/attenuation stage 670. The outputs of the master and slave DACs 650, 660 are summed at stage 680 and optionally filtered by a low pass filter 690 to generate the bias voltage, $V_{CTRL}$, for the VCDL 510 in the manner described above in conjunction with FIG. 5.

For a more detailed discussion of suitable master/slave digital-to-analog converters 450, 460, see, U.S. patent application Ser. No. 11/141,498, entitled "Method and Apparatus for Master/Slave Digital-To-Analog Conversion," filed May 31, 2005 and incorporated by reference herein.

Figure 7:
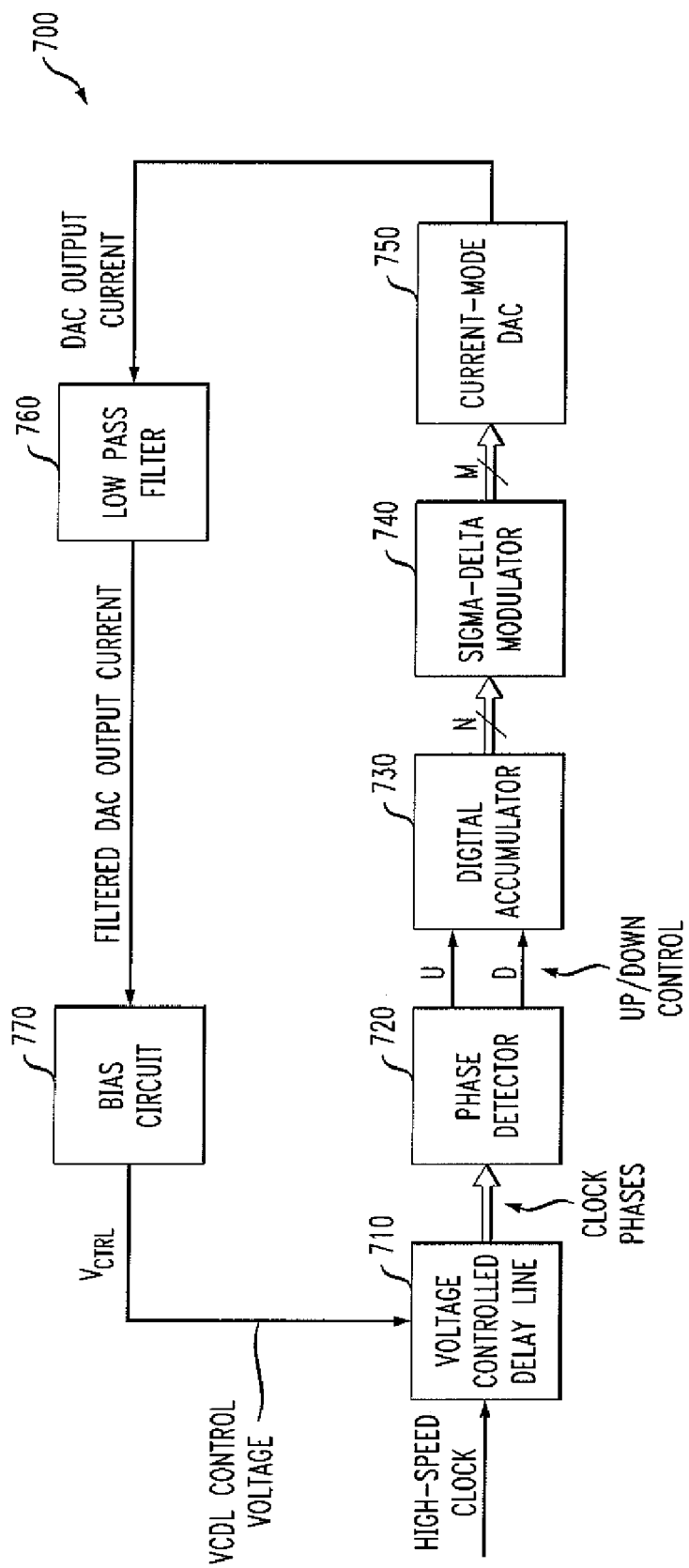
FIG. 7 is a block diagram of an alternate digital-to-analog conversion technique for a DLL circuit incorporating features of the present invention.

Although the preferred embodiments of FIGS. 5 and 6 were implemented using voltage-mode digital-to-analog converters, it can be seen that these converters may alternatively be current-mode (i.e., output a current instead of a voltage) digital-to-analog converters. For example, FIG. 7 shows an alternate digital-to-analog conversion technique for a DLL circuit 700 incorporating features of the present invention. This circuit is similar to the one shown in FIG. 5, except that DAC 750 outputs a current instead of a voltage. A bias circuit 770 generates the VCDL control voltage, $V_{CTRL}$, from a filtered version of the DAC output current. Alternatively, if VCDL 710 is replaced by a current controlled delay line, then bias circuit 770 is not required. In a similar manner, the master DAC 650 and slave DAC 660 in FIG. 6 may be replaced by current-mode digital-to-analog converters, if an appropriate bias circuit is included in the DLL, or if a current controlled delay line is used instead of a voltage controlled delay line. It is to be understood that the use of current-mode digital-to-analog converters, bias circuits, and current controlled delay lines, or any combination of these, to replace any of the blocks in the preferred embodiments are within the scope and spirit of the invention.

At least a portion of the DLL of the present invention may be implemented in an integrated circuit. In forming integrated circuits, a plurality of identical die are typically formed in a repeated pattern on a surface of a semiconductor wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

It is to be understood that the embodiments and variations shown and described herein are merely illustrative of the principles of this invention and that various modifications may be implemented by those skilled in the art without departing from the scope and spirit of the invention.

We claim:

1. A delay control method for a Delay-Locked-Loop circuit that employs a delay line to generate a clock signal based on a reference signal, comprising:
   generating a first value if said clock signal has a phase lead relative to said reference signal;
   generating a second value if said clock signal has a phase lag relative to said reference signal;
   accumulating said first and second values to generate an N bit digital word;
   reducing said N bit digital word to an M bit digital word, where M is less than N, wherein said reducing step is performed by a sigma-delta modulator; and
   converting said M bit digital word to an analog bias signal that adjusts a phase offset between said reference signal and said clock signal.

2. The method of claim 1, further comprising the step of filtering high frequency quantization noise generated by said sigma-delta modulator.

3. The method of claim 1, wherein said converting step is performed by a digital-to-analog converter.

4. The method of claim 3, wherein said digital-to-analog converter is a master/slave digital-to-analog converter.

5. The method of claim 4, wherein said master/slave digital-to-analog converter is comprised of a master digital-to-analog converter and a slave digital-to-analog converter and wherein each step of said slave digital-to-analog converter is proportional to a value generated by said master digital-to-analog converter.

6. The method of claim 5, further comprising the steps of setting said master digital-to-analog converter to a maximum value and maintaining said slave digital-to-analog converter at a mid-range value upon a reset.

7. The method of claim 5, further comprising the steps of maintaining a value of said master digital-to-analog converter and allowing a value of said slave digital-to-analog converter to vary upon detection of a predefined event.

8. The method of claim 7, wherein said predefined event is a change in direction of a phase control signal.

9. A delay control method for a Delay-Locked-Loop circuit that employs a delay line to generate a clock signal based on a reference signal, comprising:
   generating a first value if said clock signal has a phase lead relative to said reference signal;
   generating a second value if said clock signal has a phase lag relative to said reference signal;
   accumulating said first and second values to generate a first digital word;
   applying said first digital word to a sigma-delta modulator to generate a second digital word having high frequency quantization noise;
   converting said second digital word to an analog bias signal that adjusts a phase offset between said reference signal and said clock signal; and
   applying said analog bias signal to a low pass filter to reduce said high frequency quantization noise.

10. The method of claim 9, wherein said converting step is performed by a digital-to-analog converter.

11. The method of claim 10, wherein said digital-to-analog converter is a master/slave digital-to-analog converter.

12. A Delay-Locked-Loop circuit that employs a delay line to generate a clock signal based on a reference signal, comprising:
   a phase comparator generating a first value if said clock signal has a phase lead relative to said reference signal and a second value if said clock signal has a phase lag relative to said reference signal;
   a digital accumulator for accumulating said first and second values to generate an N bit digital word;
   a sigma-delta modulator for generating an M bit digital word based on said N bit digital word; and
   a digital-to-analog converter for converting said M bit digital word to an analog bias signal that adjusts a phase offset between said reference signal and said clock signal.

13. The Delay-Locked-Loop circuit of claim 12, further comprising a low pass filter to filter high frequency quantization noise generated by said sigma-delta modulator.

14. The Delay-Locked-Loop circuit of claim 12, wherein said digital-to-analog converter is a master/slave digital-to-analog converter.

15. The Delay-Locked-Loop circuit of claim 14, wherein said master/slave digital-to-analog converter is comprised of a master digital-to-analog converter and a slave digital-to-analog converter and wherein each step of said slave digital-to-analog converter is proportional to a value generated by said master digital-to-analog converter.

16. The Delay-Locked-Loop circuit of claim 15, wherein said master digital-to-analog converter is set to a maximum value and said slave digital-to-analog converter is maintained at a mid-range value upon a reset.

17. The Delay-Locked-Loop circuit of claim 15, wherein a value of said master digital-to-analog converter is maintained and a value of said slave digital-to-analog converter is allowed to vary upon detection of a predefined event.

18. The Delay-Locked-Loop circuit of claim 17, wherein said predefined event is a change in direction of a phase control signal.

19. The Delay-Locked-Loop circuit of claim 17, further comprising a finite state machine for detecting said predefined event.

20. A Delay-Locked-Loop circuit that employs a delay line to generate a clock signal based on a reference signal, comprising:
  a phase comparator generating a first value if said clock signal has a time lead relative to said reference signal and a second value if said clock signal has a time lag relative to said reference signal;
  a digital accumulator for accumulating said first and second values to generate an N bit digital word; and
  a master/slave digital-to-analog converter for generating an analog bias signal that adjusts a time delay between said reference signal and said clock signal, wherein said master/slave digital-to-analog converter is comprised of a master digital-to-analog converter path and a slave digital-to-analog converter path and wherein said slave digital-to-analog converter path comprises a sigma-delta modulator for generating an M bit digital word based on said N bit digital word, wherein said M bit digital word is applied to a slave digital-to-analog converter.

21. The Delay-Locked-Loop circuit of claim 20, further comprising a low pass filter to filter high frequency quantization noise generated by said sigma-delta modulator.

22. The Delay-Locked-Loop circuit of claim 20, wherein said master digital-to-analog converter is set to a maximum value and said slave digital-to-analog converter is maintained at a mid-range value upon a reset.

23. The Delay-Locked-Loop circuit of claim 20, wherein a value of said master digital-to-analog converter is maintained and a value of said slave digital-to-analog converter is allowed to vary upon detection of a predefined event.

24. The Delay-Locked-Loop circuit of claim 23, wherein said predefined event is a change in direction of a phase control signal.

\* \* \* \* \*